(12) United States Patent
Kobayakawa et al.

(10) Patent No.: US 9,041,016 B2
(45) Date of Patent: May 26, 2015

(54) LED MODULE

(75) Inventors: Masahiko Kobayakawa, Kyoto (JP);
Takashi Moriguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 70 days.

(21) Appl. No.: 13/369,571

(22) Filed: Feb. 9, 2012

(65) Prior Publication Data

US 2012/0205677 A1 Aug. 16, 2012

(30) Foreign Application Priority Data

Feb. 10, 2011 (JP) ................................. 2011-026857

(51) Int. Cl.
| | |
|---|---|
| *H01L 29/18* | (2006.01) |
| *H01L 21/00* | (2006.01) |
| *H01L 33/48* | (2010.01) |
| *H01L 33/62* | (2010.01) |
| *H01L 25/075* | (2006.01) |

(52) U.S. Cl.
CPC .............. *H01L 33/486* (2013.01); *H01L 33/62* (2013.01); *H01L 25/0753* (2013.01); *H01L 2224/48091* (2013.01); *H01L 2224/48227* (2013.01)

(58) Field of Classification Search
CPC ..... H01L 25/048; H01L 27/288; H01L 27/30; H01L 27/32; H01L 27/3239; H01L 31/143; H01L 31/162; H01L 33/06; H01L 33/08; H01L 33/18; H01L 33/24; H01L 33/26; H01L 51/0032; H01L 51/50

USPC .............. 257/678–733, 787–796; 438/26, 27, 438/122, 118

See application file for complete search history.

(56) References Cited

U.S. PATENT DOCUMENTS

| 6,392,294 B1 * | 5/2002 | Yamaguchi .................... 257/690 |
| 2007/0194333 A1 * | 8/2007 | Son .................................. 257/88 |
| 2008/0099770 A1 * | 5/2008 | Mendendorp et al. .......... 257/79 |
| 2009/0001400 A1 * | 1/2009 | Kim et al. ....................... 257/98 |
| 2009/0296413 A1 * | 12/2009 | Fukui ............................. 362/373 |
| 2010/0277919 A1 * | 11/2010 | Okada et al. ............. 362/249.02 |
| 2011/0012144 A1 * | 1/2011 | An .................................... 257/91 |
| 2011/0031523 A1 * | 2/2011 | Ishii et al. ....................... 257/98 |
| 2011/0233601 A1 * | 9/2011 | Nakayama ....................... 257/99 |

FOREIGN PATENT DOCUMENTS

JP 2006-024794 1/2006

* cited by examiner

*Primary Examiner* — Chuong A Luu
*Assistant Examiner* — Moin Rahman
(74) *Attorney, Agent, or Firm* — Hamre, Schumann, Mueller & Larson, P.C.

(57) ABSTRACT

An LED module includes a substrate, one or more LED chips supported by a main surface of the substrate, and wirings. The substrate has one or more through holes penetrating from the main surface to a rear surface. The wirings are formed on the substrate and make electrical conduction with the LED chips. The wirings include pads which are formed on the main surface and make electrical conduction with the LED chips, rear surface electrodes which are formed on the rear surface, and through wirings which make electrical conduction between the pads and the rear surface electrodes and are formed on the inner sides of the through holes.

13 Claims, 8 Drawing Sheets

LED MODULE

CROSS-REFERENCE TO RELATED APPLICATIONS

This application is based upon and claims the benefit of priority from Japanese Patent Application No. 2011-26857, filed on Feb. 10, 2011, the entire contents of which are incorporated herein by reference.

TECHNICAL FIELD

The present disclosure relates to an LED module incorporating LED chips, and more particularly, a so-called side view type LED module.

BACKGROUND

FIG. 14 shows a conventional LED module in a related art. As shown in FIG. 14, an LED module 900 has a structure where three LED chips 931, 932 and 933 are mounted on a long rectangular substrate 910. The substrate 910 is formed with a plurality of electrodes 921, 922, 923 and 924. The electrodes 921, 922 and 923 are respectively die-bonded with LED chips 931, 932 and 933. The electrode 924 is a so-called common electrode which makes electrical conduction with the LED chips 931, 932 and 933 via a wire. The three LED chips 931, 932 and 933 are surrounded by a case 950. The case 950 is made of frame-like opaque resin material and its inner space is filled with light transmitting resin (not shown). The LED module 900 is configured as a so-called side view type LED module which is mounted on a circuit board, with a lower surface (in the drawing) extending in a longitudinal direction of the substrate 910 as a mounting surface. The LED chips 931, 932 and 933 emit red, green and blue light, respectively. The LED module 900 is configured to emit white light by mixing the light from these LED chips 931, 932 and 933.

However, there are ever increasing requirements for reducing the size of the LED module 900. For example, in order to restrict a projecting height of the LED module 900 from the circuit board on which the LED module 900 is mounted, there is a need to make the substrate 910 more compact. This reduces the space for mounting the LED chips 931, 932 and 933. To mount the LED chips 931, 932 and 933, additional space, in addition to the space needed for the LED chips 931, 932 and 933, is needed for wires connected to these LED chips and a portion of the common electrode 924 to which these wires are connected. In addition, the area ratio of the electrodes 922 and 923 to the substrate 910 is not small. Thus, this makes it difficult to achieve a compact substrate 910.

SUMMARY

The present disclosure provides some embodiments of a side view type LED module capable of being compact.

According to one aspect of the present disclosure, there is provided an LED module including a substrate, one or more LED chips and wirings. The substrate includes rectangular main and rear surfaces which are in opposite to each other, and a bottom surface which is a mounting surface and connects long sides of the main and rear surfaces. The substrate includes one or more through holes penetrating from the main surface to the rear surface. One or more LED chips are supported by the main surface of the substrate. The wirings are formed on the substrate and make electrical conduction with the LED chips. The wirings include pads, rear surface electrodes and through wirings. The pads are formed on the main surface and make electrical conduction with the LED chips. The rear surface electrodes are formed on the rear surface. The through wirings make electrical conduction between the pads and the rear surface electrodes and are formed on the inner sides of the through holes.

In one embodiment, the wirings expose the entirety of the bottom surface of the substrate.

In another embodiment, three spaced LED chips are arranged along a longitudinal direction of the main surface.

In another embodiment, the substrate has two through holes and the wirings include two through wirings.

In another embodiment, the two through wirings deviate from the LED chips making electrical conduction with the two through wirings in the longitudinal direction and overlap with the LED chips in a transverse direction of the main surface.

In another embodiment, the rear surface electrodes respectively include two individual electrodes making electrical conduction with the through wirings.

In another embodiment, the two through holes are disposed in a portion in the substrate opposite to the bottom surface in the transverse direction.

In another embodiment, the substrate has a pair of lateral sides and two corner grooves. A pair of lateral sides connects the main surface and the rear surface in both ends of the substrate in the longitudinal direction. The two corner grooves are interposed between the lateral sides and the bottom surface, and reach the main surface and the rear surface in a thickness direction of the substrate. Further, the wirings include two corner groove wirings formed on the inner sides of the two corner grooves.

In another embodiment, one of the two corner groove wirings makes electrical conduction with a plurality of LED chips and the rear surface electrodes include an end common electrode connected to the corner groove wiring.

In another embodiment, the other of the two corner groove wirings makes electrical conduction with one of the plurality of LED chips and the rear surface electrodes include an end individual electrode connected to the corner groove wiring.

In another embodiment, the corner grooves have a quadrant-circular section.

In another embodiment, the wirings include a main surface interconnection wiring, a branch-like wiring and a wire. The main surface interconnection wiring is placed near the bottom surface in the transverse direction with respect to the LED chips. The main surface interconnection wiring extends in the longitudinal direction and is connected to the corner groove wiring making electrical conduction with the end common electrode. The branch-like wiring extends from the main surface interconnection wiring between two LED chips. With this configuration, the wire connects the two LED chips and the branch-like wiring.

In another embodiment, the LED module further includes an insulating film which is provided near the rear surface and covers at least a portion of the individual electrodes and the through holes.

In another embodiment, the LED module further includes light transmitting resin covering the three LED chips.

In another embodiment, the light transmitting resin has a trapezoidal section perpendicular to the transverse direction.

In another embodiment, the light transmitting resin has a rectangular section perpendicular to the longitudinal direction.

In another embodiment, the substrate has three through holes and the wirings include three through wirings.

In another embodiment, the three through wirings deviate from the LED chips making electrical conduction with the three through wirings in the transverse direction and overlap with the LED chips in a longitudinal direction of the main surface.

In another embodiment, one of the three through wirings making electrical conduction with one of the three LED chips inserted between the other two LED chips in the longitudinal direction is placed in a position in the transverse direction which is located opposite the two remaining through wirings.

In another embodiment, the wirings have die bonding pads as the pads to which the LED chips are die-bonded, and the die bonding pads overlap with the through holes when viewed in the thickness direction of the substrate.

In another embodiment, the rear surface electrodes respectively include three individual electrodes making electrical conduction with the through wirings.

In another embodiment, one of the two corner groove wirings makes electrical conduction with two of the LED chips and the other of the two corner groove wirings makes electrical conduction with one of the LED chips. With this configuration, the rear surface electrodes respectively include two end common electrodes connected to the corner groove wirings.

In another embodiment, the corner grooves have a quadrant-circular section.

In another embodiment, the LED module further includes a reflector and light transmitting resin. The reflector is formed on the main surface and has a reflecting surface surrounding the three LED chips. The light transmitting resin fills a region surrounded by the reflecting surface and covers the three LED chips.

In another embodiment, the wirings include bonding pads as the pads, and a wire connecting the bonding pads and one of the three LED chips. One of the three through holes overlaps with the bonding pads, and one of the three through wirings makes electrical conduction with the bonding pads.

In another embodiment, the wirings have two die bonding pads as the pads to which two of the three LED chips are die-bonded, and the two die bonding pads overlap with the two through holes when viewed in the thickness direction of the substrate.

In another embodiment, the rear surface electrodes include two individual electrodes respectively making electrical conduction with the two die bonding pads via the two through wirings formed in the two through holes.

In another embodiment, the rear surface electrodes include an end common electrode and an end individual electrode. The end common electrode is connected to one of the two corner groove wirings and makes electrical conduction with the three LED chips. The end individual electrode is connected to the other of the two corner groove wirings and makes electrical conduction with one of the three LED chips.

In another embodiment, the wirings include a rear surface interconnection wiring which is formed on the rear surface and connects the end common electrode and the through wirings which make no electrical conduction with the two individual electrodes.

Other features and advantages of the present disclosures will be more apparent from the following detailed description in conjunction with the accompanying drawings.

DETAILED DESCRIPTION

Figure 1:
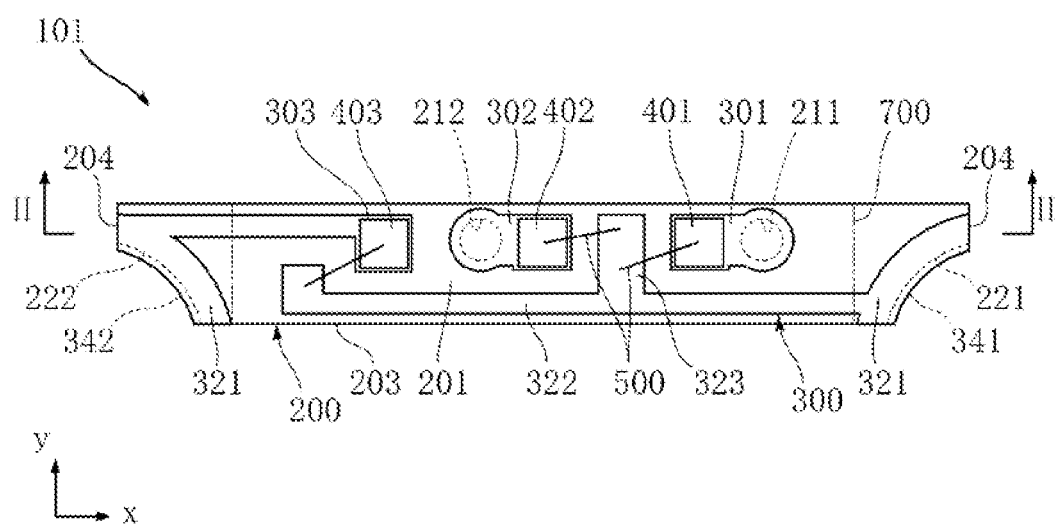
FIG. 1 is a front view showing main parts of an LED module according to a first embodiment of the present disclosure.
Figure 2:
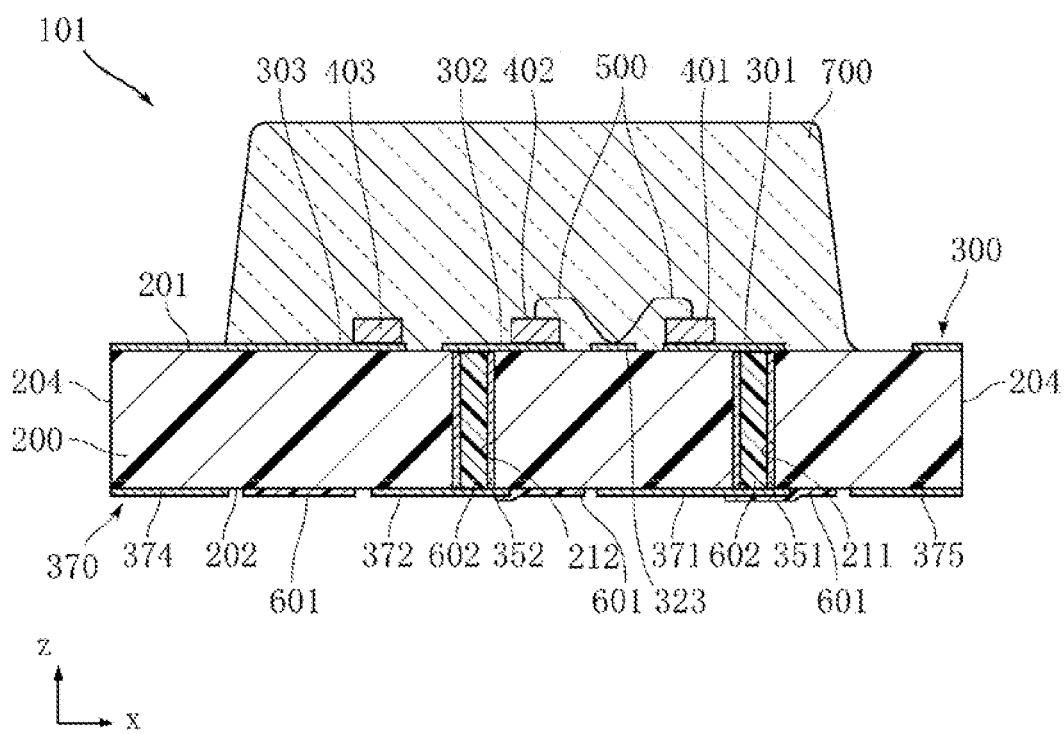
FIG. 2 is a sectional view taken along line II-II in FIG. 1.
Figure 3:
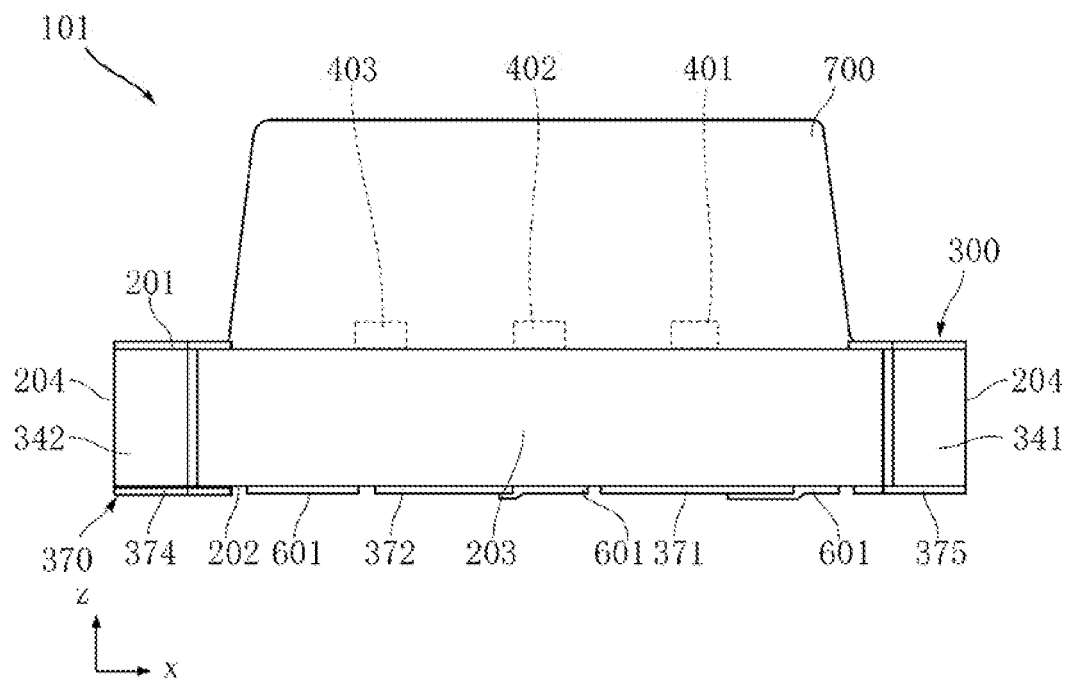
FIG. 3 is a bottom view showing the LED module of FIG. 1.

Some embodiments of the present disclosure will now be described in detail with reference to the drawings.

FIGS. 1 to 5 show an LED module according to a first embodiment of the present disclosure. In this embodiment, an LED module 101 includes a substrate 200, wirings 300, three LED chips 401, 402 and 403 and light transmitting resin 700. The LED module 101 is formed as a side view type LED module which is mounted on a circuit board 801 with a posture shown in FIG. 5. In this embodiment, the LED module 101 has sizes of about 3.0 mm in the x-direction, about 0.43 mm in the y-direction and about 1.3 mm in the z-direction.

Figure 4:
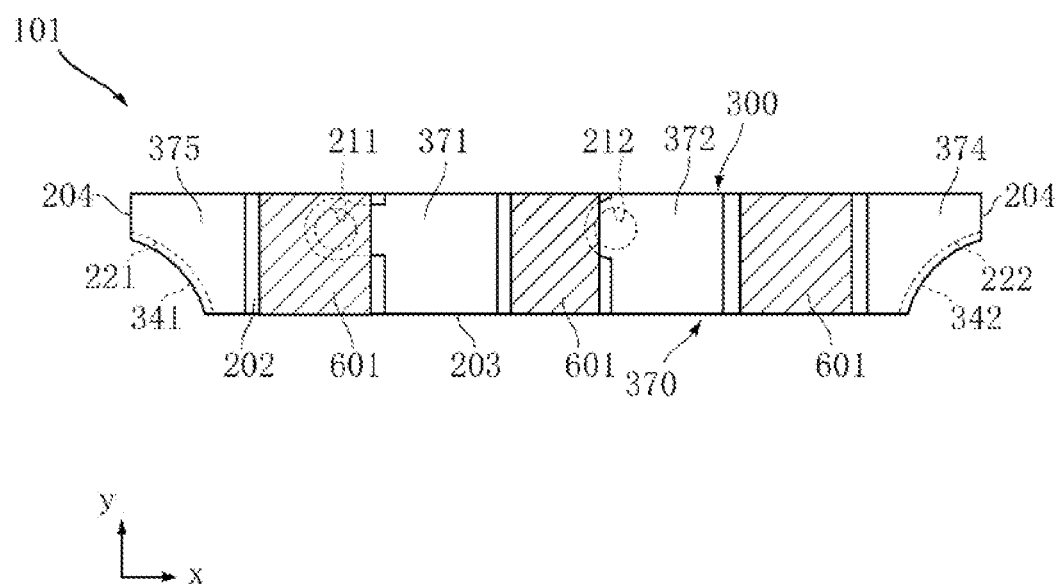
FIG. 4 is a rear view showing the LED module of FIG. 1.
Figure 5:
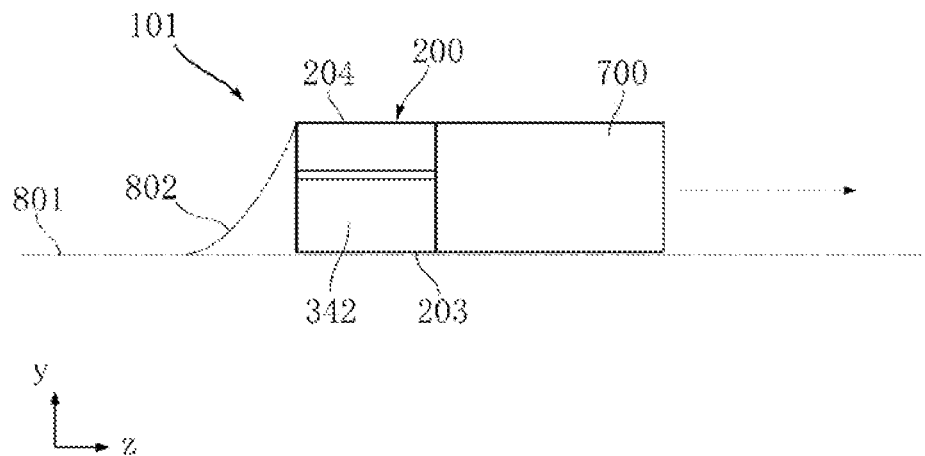
FIG. 5 is a side view showing the LED module of FIG. 1.

The substrate 200 is an insulating substrate made of, for example, glass epoxy resin and has a rectangular parallelepiped shape with the x direction as a longitudinal direction, the y direction as a traverse direction and the z direction as a thickness direction. The substrate 200 includes a main surface 201, a rear surface 202, a bottom surface 203 and two lateral sides 204. In addition, the substrate 200 is formed with two through holes 211 and 212 and two corner grooves 221 and 222. As shown in FIGS. 1 and 4, the through holes 211 and 212 are placed in a portion in the substrate 200 opposite the bottom surface 203 in the y direction. In this embodiment, the substrate 200 has an x-direction dimension of about 3.0 mm, a y-direction dimension of about 0.43 mm and a z-direction dimension of about 0.5 mm.

The two through holes 211 and 212 penetrate through the substrate 200 in the z direction and extend from the main surface 210 to the rear surface 202. The corner grooves 221 and 222 are interposed between the lateral sides 204 and the bottom surface 203 and extend in the z direction. The corner grooves 221 and 222 extend from the main surface 201 to the rear surface 202 and have a quadrant-circular section.

The wirings 300 form paths for supplying power to the three LED chips 401, 402 and 403 and include die bonding pads 301, 302 and 303, two quadrant-annular portions 321, a main surface interconnection wiring 322, a branch-like wiring 323, corner groove wirings 341 and 342, through wirings 351 and 352 and rear surface electrodes 370. The wirings 300 have a stacked structure of Cu, Ni and Au plating.

The die bonding pads 301, 302 and 303 are arranged in the x direction and are bonded with the LED chips 401, 402 and 403, respectively. The die bonding pads 301 and 302 have a combined shape of a square portion and a circular portion. Circular portions of the die bonding pads 301 and 302 are opposite to each other in the x direction. The die bonding pad 303 has a square portion and a stripe shape portion extending in the x direction.

The quadrant-annular portions 321 are formed near a portion of the main surface 201 connected to the corner grooves 221 and 222. The main surface interconnection wiring 322 has a stripe shape extending from the quadrant-annular portion 321 formed near the corner groove 221 in the x direction and is disposed near one end of the main surface 201 in the y direction. The branch-like wiring 323 extends in the y direction between the die bonding pads 301 and 302 from the middle portion of the main surface interconnection wiring 322.

The corner groove wires 341 and 342 are formed to cover the inner sides of the corner grooves 221 and 222 of the substrate 200 and extend from the main surface 201 to the rear surface 202. The through wirings 351 and 352 are formed in the inner sides of the through holes 211 and 212, respectively and have a cylindrical shape. The through wires 351 and 352 extend from the main surface 201 to the rear surface 202. In this embodiment, the inside of the through wirings 351 and 352 is filled with resin 602.

The rear surface electrodes 370 are formed on the rear surface 202. In this embodiment, the rear surface electrodes 370 include individual electrodes 371 and 372, an end individual electrode 374 and an end common electrode 375. The individual electrodes 371 and 372, the end individual electrode 374 and the end common electrode 375 are arranged in the x direction. The individual electrodes 371 and 372 are interposed between the end individual electrode 374 and the end common electrode 375. The individual electrode 371 overlaps with the through hole 211 when viewed in the z direction and is connected to the through wiring 351. The individual electrode 372 overlaps with the through hole 212 when viewed in the z direction and is connected to the through wiring 352. The end individual electrode 374 is disposed near one end of the rear surface 202 and is connected to the corner groove wiring 342. The end common electrode 375 is disposed near the other end of the rear surface 202 and is connected to the corner groove wiring 341.

In this embodiment, a plurality of insulting films 601 is formed on the rear surface 202. These insulating films 601 cover exposed portions of the rear surface 202 from the rear surface electrodes 370 and portions of the individual electrodes 371 and 372. The wirings 300 are not formed on the bottom surface 203 and the bottom surface 203 is entirely exposed. When the LED module 101 is mounted on the circuit board 801 shown in FIG. 5, a solder fillet 802 is formed, which is connected to the pads (not shown) of the circuit board 801 and the individual electrodes 371 and 372. The end individual electrode 374 and the end common electrode 375 also include the solder fillet 802 formed therein, with a portion of the solder fillet 802 filled in a space defined by the end individual electrode 374 or the end common electrode 375 and the circuit board 801.

The LED chips 401, 402 and 403 are light sources of the LED module 101 and have a stacked structure including, for example, a p-type semiconductor layer, an n-type semiconductor layer and an active layer interposed therebetween. The LED chip 401 is die-bonded to the die bonding pad 301 and emits blue light, for example. The LED chip 402 is die-bonded to the die bonding pad 302 and emits red light, for example. The LED chip 403 is die-bonded to the die bonding pad 303 and emits green light, for example. The LED chips 401 and 402 are connected to the branch-like wiring 323 via wires 500, respectively. The LED chip 403 is connected to the main surface interconnection wiring 322 via another wire 500.

The individual electrode 371 makes electrical conduction with the LED chip 401 via the through wiring 351. The individual electrode 372 makes electrical conduction with the LED chip 402 via the through wiring 352. The end individual electrode 374 makes electrical conduction with the LED chip 403 via the corner groove wiring 342. The end common electrode 375 makes electrical conduction with the LED chips 401, 402 and 403 via the corner groove wiring 341.

Light transmitting resin 700 is formed on the main surface 201 of the substrate 200 and covers the LED chips 401, 402 and 403. The light transmitting resin 700 is transparent resin such as, epoxy resin, or resin which is capable of transmitting light from the LED chips 401, 402 and 403. In this embodiment, the light transmitting resin 700 has a trapezoidal shape when viewed in the y direction and a rectangular shape when viewed in the x direction. The light transmitting resin 700 has, for example, a size of about 0.8 mm in the z-direction.

Next, operation of the LED module 101 will be described.

According to this embodiment, a path from the individual electrodes 371 and 372 via the through wirings 351 and 352 is used to supply power to the LED chips 401 and 402. This path does not have a portion which surrounds the area from the main surface 201 or the rear surface 202 into the bottom surface 203. Thus, a space to be secured in the main surface 201 and the rear surface 202 for forming the wirings 300 may be reduced, thereby achieving compactness of the LED module 101.

A path from the end individual electrode 374 and the end common electrode 375 through the corner groove wirings 341 and 342 is used to supply power to the LED chips 401, 402 and 403. Accordingly, the bottom surface 203 is not covered with the wirings 300 at all. That is, there is no portion surrounding the wirings 300 that exists from the main surface 201 or the rear surface 202 into the bottom surface 203. Thus, the space to be secured in the main surface 201 and the rear surface 202 for forming the wirings 300 may be further reduced.

As shown in FIG. 4, the through holes 211 and 212 are separated from the bottom surface 203 in the y direction. This can prevent the mounting position of the LED module 101 from being disturbed by any unintended deformation of the individual electrodes 371 and 372 due to the existence of the through holes 211 and 212.

FIGS. 6 to 13 show LED modules according to other alternate embodiments of the present disclosure. In these drawings, the same or similar elements as the first embodiment are denoted by the same reference numerals.

FIGS. 6 to 9 show an LED module according to a second embodiment of the present disclosure. An LED module 102 of this embodiment includes three through holes 211, 212 and 213, three individual electrodes 371, 372 and 373 and two end common electrodes 375 and 376. The LED module 102 further includes a reflector 710. The LED module 102 has an x-direction dimension of about 2.0 mm, a y-direction dimension of about 0.5 mm and a z-direction dimension of about 0.9 mm. For the purpose of convenience of understanding, the light transmitting resin 700 is not shown in FIG. 6.

Figure 6:
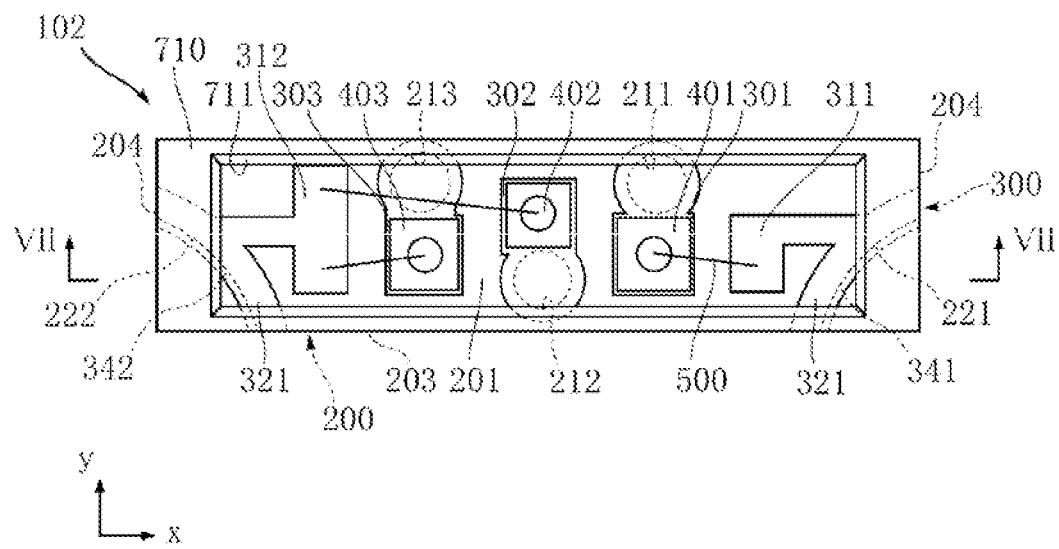
FIG. 6 is a front view showing main parts of an LED module according to a second embodiment of the present disclosure.
Figure 7:
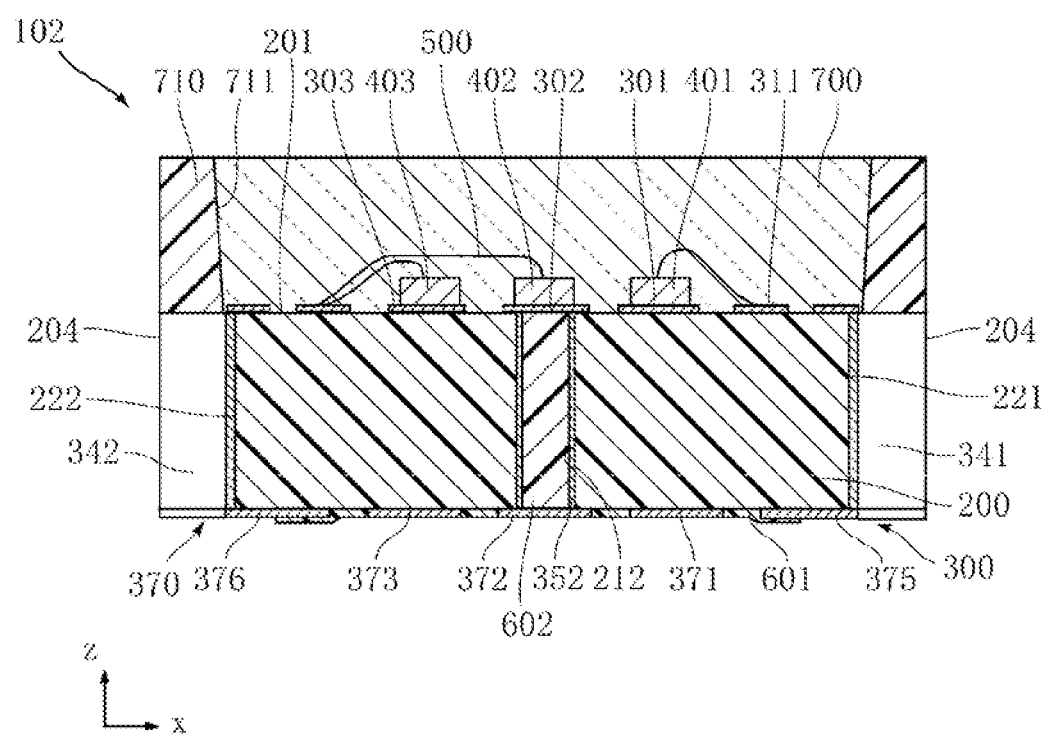
FIG. 7 is a sectional view taken along line VII-VII in FIG. 6.
Figure 8:
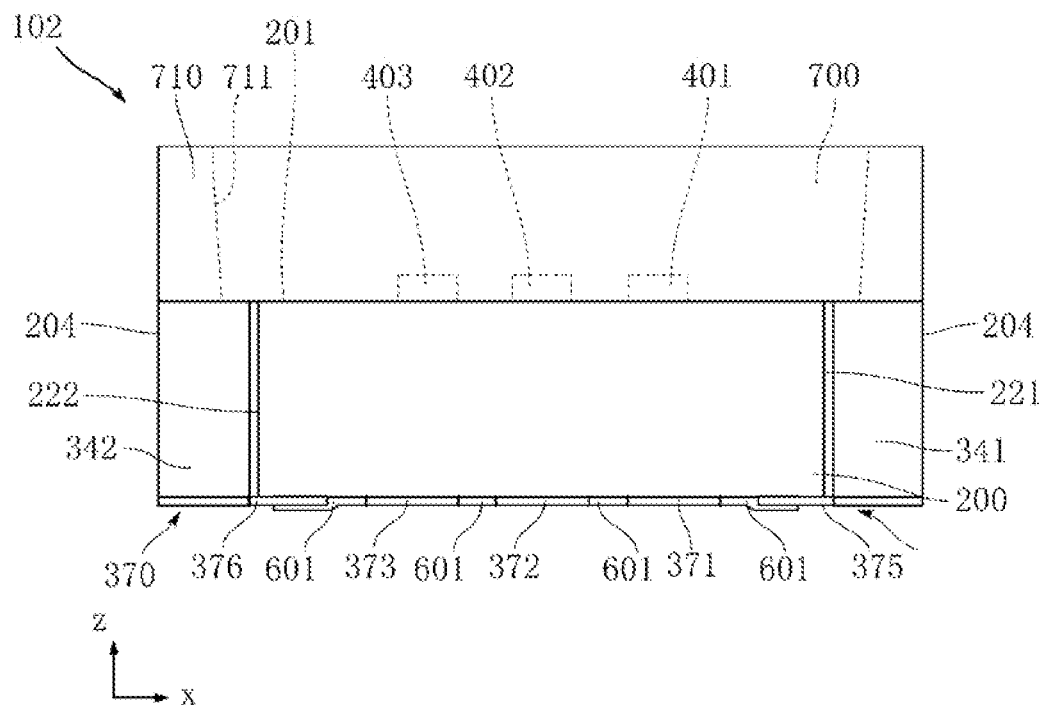
FIG. 8 is a bottom view showing the LED module of FIG. 6.
Figure 9:
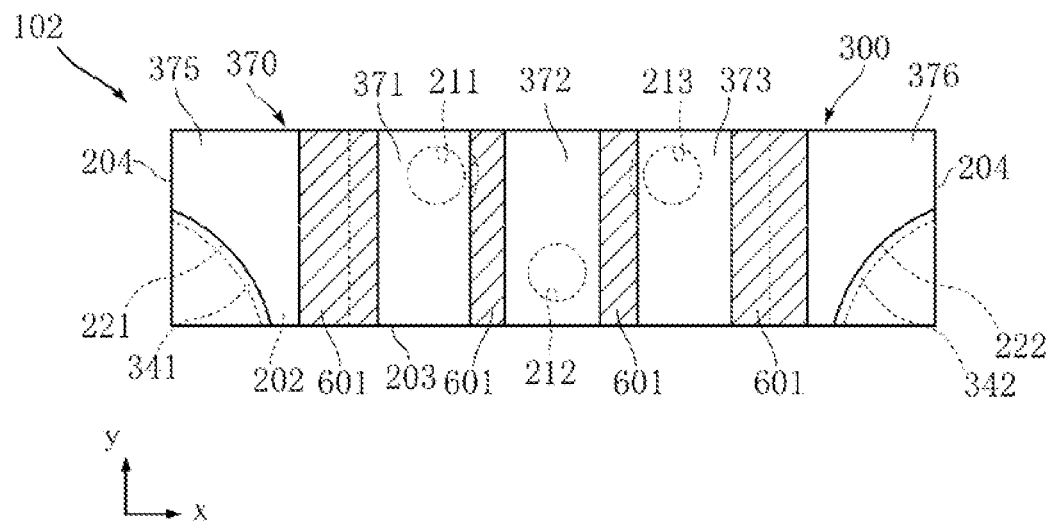
FIG. 9 is a rear view showing the LED module of FIG. 6.
Figure 10:
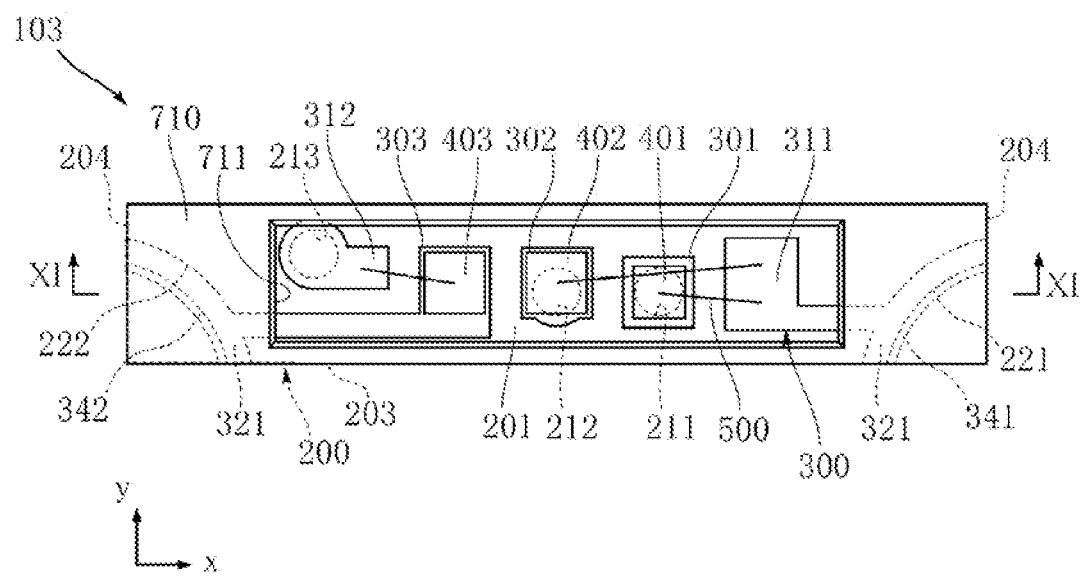
FIG. 10 is a front view showing main parts of an LED module according to a third embodiment of the present disclosure.
Figure 11:
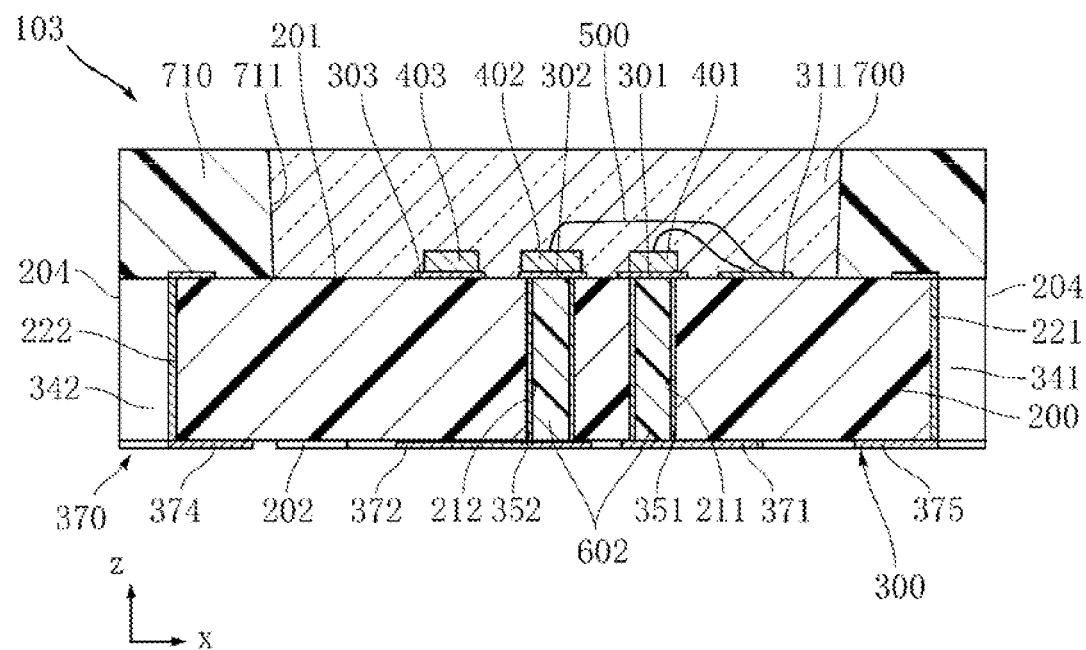
FIG. 11 is a sectional view taken along line XI-XI in FIG. 10.
Figure 12:
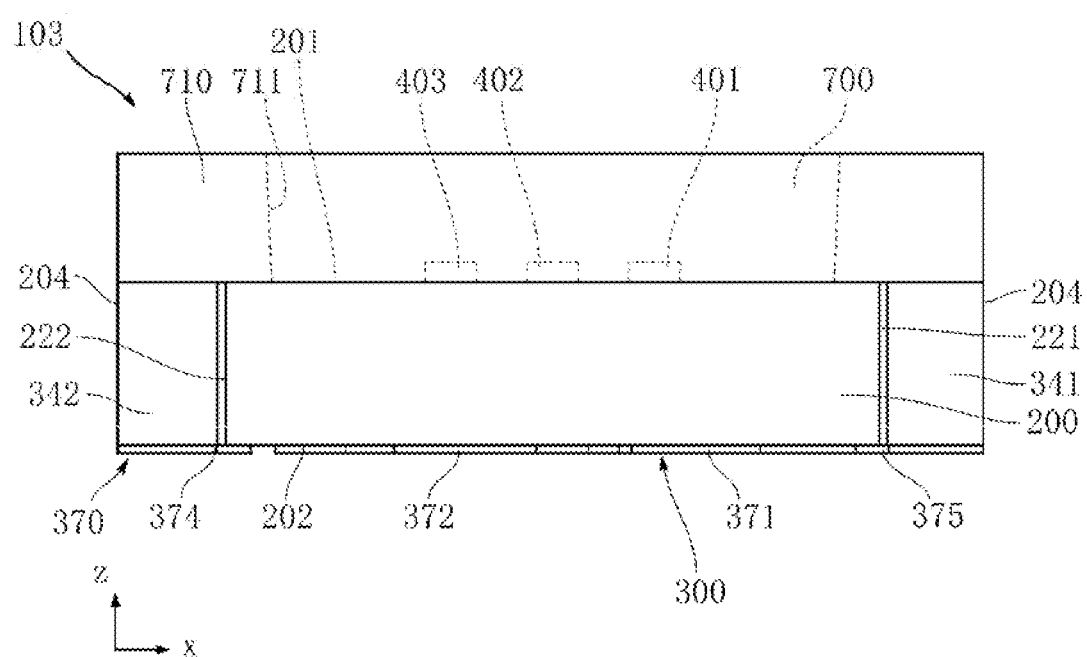
FIG. 12 is a bottom view showing the LED module of FIG. 10.
Figure 13:
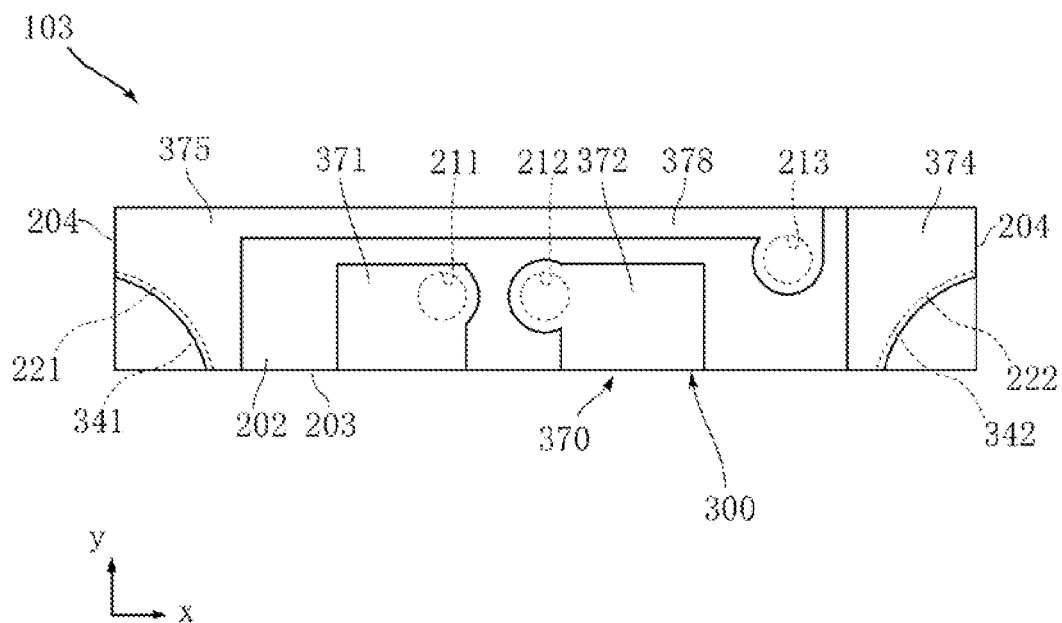
FIG. 13 is a rear view showing the LED module of FIG. 10.
Figure 14:
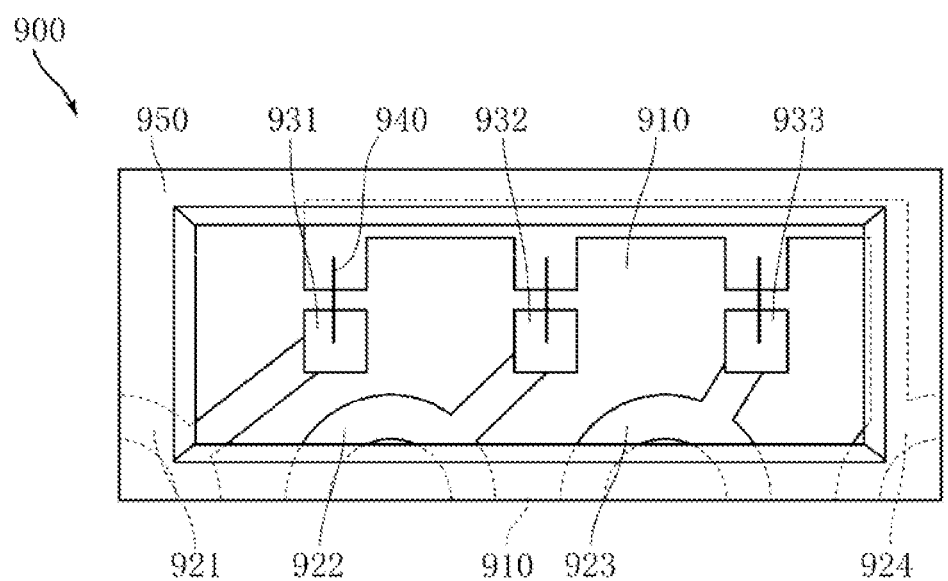
FIG. 14 is a front view showing main parts of a conventional LED module.

A substrate 200 is formed with the three through holes 211, 212 and 213. Through wirings 351, 352 and 353 (the through wirings 351 and 353 not shown) are formed on the inner sides of these through holes 211, 212 and 213. The individual electrodes 371, 372 and 373 are connected to the through wirings 351, 352 and 353, respectively. Three die bonding pads 301, 302 and 303 are formed on a main surface 201. Three LED chips 401, 402 and 403 are die-bonded to the die bonding pads 301, 302 and 303, respectively, and make electrical conduction with the through wirings 351, 352 and 353, respectively. The through holes 211 and 213 (the through wirings 351 and 353) are disposed above the LED chips 401 and 403, respectively, as shown in FIG. 6. The through hole 212 (the through wire 352) is disposed below the LED chip 402, as shown in FIG. 6.

Two bonding pads 311 and 312 are formed on the main surface 201. The bonding pad 311 is connected to the LED chip 401 by a wire 500. The bonding pad 312 is connected to the LED chips 402 and 403 by different wires 500, respectively. The boding pad 311 is connected to one quadrant-annular portion 321 and makes electrical conduction with the end common electrode 375 via a corner groove wiring 341. The boding pad 312 is connected to the other quadrant-annular portion 321 and makes electrical conduction with the end common electrode 376 via a corner groove wiring 342.

The reflector 710 is made of, for example, white resin and is formed on the main surface 201. The reflector 710 has a reflecting surface 711. The reflecting surface 711 surrounds the LED chips 401, 402 and 403 and reflects light propagating from the LED chips 401, 402 and 403 in the x or y direction toward the z direction. The z-direction dimension of the reflector 710 is, for example, about 0.4 mm. A region surrounded by the reflector 710 is filled with light transmitting resin 700.

This embodiment can also achieve compactness of the LED module 102. By arranging the LED chips 401, 402 and 403 and the through holes 211, 212 and 213 in the form of a zigzag, it is possible to reduce the x-direction dimension of the substrate 200.

FIGS. 10 to 13 show an LED module according to a third embodiment of the present disclosure. An LED module 103 of this embodiment is different in configuration of wirings 300 in the main surface 201 and the rear surface 202 from the above-described LED module 102. The LED module 103 has sizes of about 2.7 mm in the x-direction, about 0.5 mm in the y-direction and about 0.9 mm in the z-direction. For the purpose of convenience of understanding, the light transmitting resin 700 is not shown in FIG. 10.

In this embodiment, a die bonding pad 303 is connected to a quadrant-annular portion 321. The quadrant-annular portion 321 is connected to a corner groove wiring 342. Rear surface electrodes 370 include an end individual electrode 374. The end individual electrode 374 is connected to the corner groove wiring 342. A bonding pad 312 connected to an LED chip 403 by a wire 500 is connected to a through wiring 353 (not shown) formed in a through hole 213. The rear surface electrodes 370 also include a rear surface interconnection wiring 378. The rear surface interconnection wiring 378 connects the through wiring 353 and an end common electrode 375. In the main surface 201, a bonding pad 311 is connected to LED chips 401 and 402 by wires 500, respectively. The bonding pad 311 makes electrical conduction with the end common electrode 375 via a corner groove wiring 341. This allows the end common electrode 375 to make electrical conduction with the LED chip 403 as well as the LED chips 401 and 402. Through holes 211 and 212 overlap with the LED chips 401 and 402, respectively, when viewed in the z direction.

This embodiment can also achieve compactness of the LED module 103. By overlapping the through holes 211 and 212 with the LED chips 401 and 402, respectively, when viewed in the z direction, it is possible to accelerate compactness of the substrate, that is, the LED module 103.

The LED module of the present disclosure is not limited to the above-described embodiments. Detailed configuration of various components of the LED module of the present disclosure may be modified in various ways in design.

According to the above embodiments, a path through the through wirings is used to supply power to the LED chips. This path does not have a portion rounded from the main surface or the rear surface into the bottom surface. This may result in reduction of a space to be secured in the main surface and the rear surface for forming the wirings, thereby achieving compactness of the LED module.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED module comprising:
   a substrate including rectangular main and rear surfaces which are opposite each other, each of the main and rear surfaces having a longer side and a shorter side;
   a side surface being a mounting surface and connecting the longer sides of the main and rear surfaces and being perpendicular to said main surface and said rear surface;
   one or more LED chips supported by the main surface of the substrate;
   a light transmitting resin formed on the main surface of the substrate, the light transmitting resin having a surface flush with the side surface of the substrate; and
   wirings which are formed on the substrate and make electrical conduction with the LED chips,
   wherein the substrate includes one or more through holes penetrating from the main surface to the rear surface,
   wherein the wirings include pads which are formed on the main surface and make electrical conduction with the LED chips, rear surface electrodes which are formed on the rear surface, and through wirings which make electrical conduction between the pads and the rear surface electrodes and are formed on the inner sides of the through holes,
   wherein three spaced LED chips are arranged along a longitudinal direction of the main surface,
   wherein the substrate includes two through holes and the wirings include two through wirings,
   wherein the substrate has a pair of lateral sides connecting the main surface and the rear surface in both ends of the substrate in the longitudinal direction and two corner grooves which are interposed between the lateral sides and the side surface, and reach the main surface and the rear surface in a thickness direction of the substrate, and
   wherein the wirings include two corner groove wirings formed on the inner sides of the two corner grooves.

2. The LED module of claim 1, wherein the wirings expose the entirety of the side surface of the substrate.

3. The LED module of claim 1, wherein the two through wirings deviate from the LED chips making electrical conduction with the two through wirings in the longitudinal direction and overlap with the LED chips in a transverse direction of the main surface.

4. The LED module of claim 1, wherein the rear surface electrodes respectively include two individual electrodes making electrical conduction with the through wirings.

5. The LED module of claim 4, wherein the two through holes are disposed in a portion in the substrate opposite the side surface in the transverse direction.

6. The LED module of claim 1, wherein one of the two corner groove wirings makes electrical conduction with a plurality of LED chips and the rear surface electrodes include an end common electrode connected to the corner groove wiring.

7. The LED module of claim 6, wherein the other of the two corner groove wirings makes electrical conduction with one of the plurality of LED chips and the rear surface electrodes include an end individual electrode connected to the corner groove wiring.

8. The LED module of claim 1, wherein the corner grooves have a quadrant-circular section.

9. The LED module of claim 6, wherein the wirings include a main surface interconnection wiring which is placed near the side surface in the transverse direction with respect to the LED chips, the main surface interconnection wiring extending in the longitudinal direction and connected to the corner groove wiring making electrical conduction with the end common electrode, a branch-like wiring extending from the main surface interconnection wiring between two LED chips, and a wire connecting the two LED chips and the branch-like wiring.

10. The LED module of claim 4, further comprising an insulating film which is provided near the rear surface and covers at least a portion of the individual electrodes and the through holes.

11. The LED module of claim 1, wherein the light transmitting resin covers the three LED chips.

12. The LED module of claim 11, wherein the light transmitting resin has a trapezoidal section perpendicular to the transverse direction.

13. The LED module of claim 12, wherein the light transmitting resin has a rectangular section perpendicular to the longitudinal direction.

\* \* \* \* \*